United States Patent
Su et al.

(10) Patent No.: US 6,885,214 B1
(45) Date of Patent: Apr. 26, 2005

(54) METHOD FOR MEASURING CAPACITANCE-VOLTAGE CURVES FOR TRANSISTORS

(75) Inventors: Hung-Der Su, Kao-Hsiung County (TW); Shien-Yang Wu, Hsin-chu (TW); Yung-Shun Chen, Hsin chu (TW); Kuan-Yao Wang, Anding Township, Tainan County (TW); Sun-Jay Chang, Taidung County (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 24 days.

(21) Appl. No.: 10/689,431

(22) Filed: Oct. 20, 2003

(51) Int. Cl.[7] .............................................. G01R 31/26

(52) U.S. Cl. ...................... 324/765; 324/769

(58) Field of Search ........................... 324/71.1, 719, 324/765–769, 158.1; 257/40, 48, 318, 322; 438/10, 14, 16–18

(56) References Cited

U.S. PATENT DOCUMENTS

| | | | | |
|---|---|---|---|---|
| 5,032,786 A | * | 7/1991 | Kimura | 324/765 |
| 5,485,097 A | | 1/1996 | Wang | 324/765 |
| 5,561,387 A | * | 10/1996 | Lee | 324/765 |
| 5,793,675 A | | 8/1998 | Cappelletti et al. | 365/185.09 |
| 6,011,404 A | | 1/2000 | Ma et al. | 324/765 |
| 6,066,952 A | | 5/2000 | Nowak et al. | 324/458 |
| 6,339,339 B2 | | 1/2002 | Maeda | 324/769 |
| 6,456,105 B1 | | 9/2002 | Tao | 324/769 |
| 6,472,233 B1 | | 10/2002 | Ahmed et al. | 438/14 |
| 6,472,236 B1 | | 10/2002 | Wang et al. | 438/14 |

OTHER PUBLICATIONS

"Gate Dielectric Capacitance–Voltage Characterization Using the Model 4200 Semiconductor Characterization System," Keithley, Application Notes Series, No. 2239, no month/year.

*Agilent Technologies Impedance Measurement Handbook*, 2nd Edition, Application Note 5950, Staff, Agilent Technologies Co. Ltd., Palo Alto, CA, Copyright 2000, 5–12 to 5–14, no month.

"Evaluation of Gate Oxides Using a Voltage Step Quasi-Static CV Method", Application Note 4156–10, *Agilent Technologies*, pp. 1–4, no month/yr.

MOS Capacitance Measurements for High–Leakage Thin Dielectrics, vol. 46, No. 7, Jul. 1999, pp. 1500–1501.

"MOS C–V Characterization of Ultrathin Gate Oxide Thickness (1.3–1.8 nm)", Choi et al., IEEE Electron Device Letters, vol. 20, No. 6, Jun. 1999, pp. 292–294.

* cited by examiner

*Primary Examiner*—Minh N. Tang
(74) *Attorney, Agent, or Firm*—Thomas, Kayden, Horstemeyer & Risley

(57) ABSTRACT

An apparatus for characterizing capacitance and thickness of an insulating layer constructed between a conductive gate and a substrate has at least one test structure formed at a surface of a substrate. Each test structure has a bulk region formed of a semiconductor within the surface. Further the test structure has at least one source region and one drain region within the bulk region. A thin insulating layer is placed above the each source region, each drain region, and the bulk region. A conductive gate is placed above the thin insulating layer. A capacitance-voltage measuring device measures a capacitance value of the test structure, while forcing the bulk region between the source region and the drain region to be floating. An insulating layer thickness calculator determines the thickness of the insulating layer from the capacitance.

32 Claims, 6 Drawing Sheets

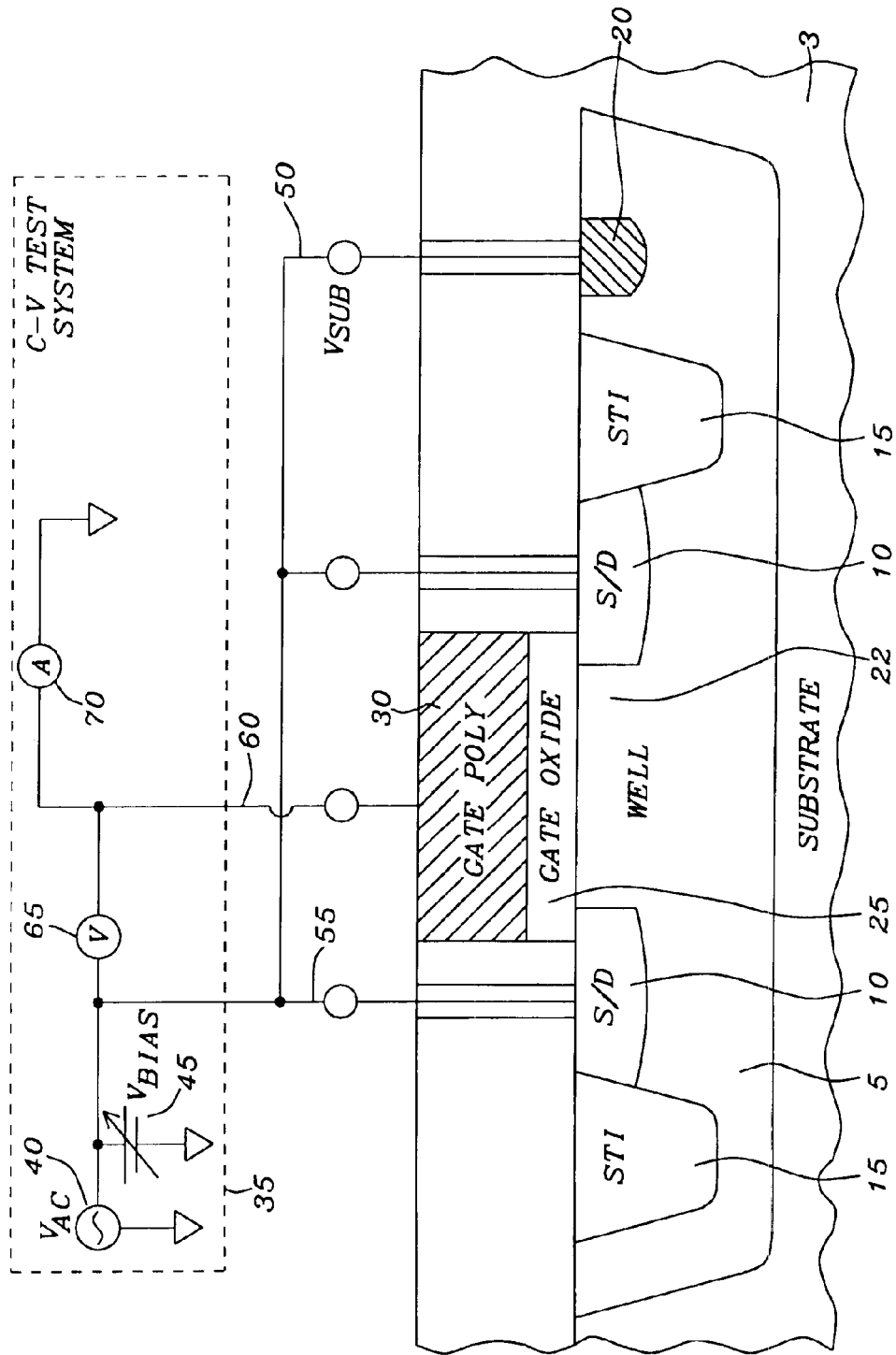
FIG. 1 – Prior Art

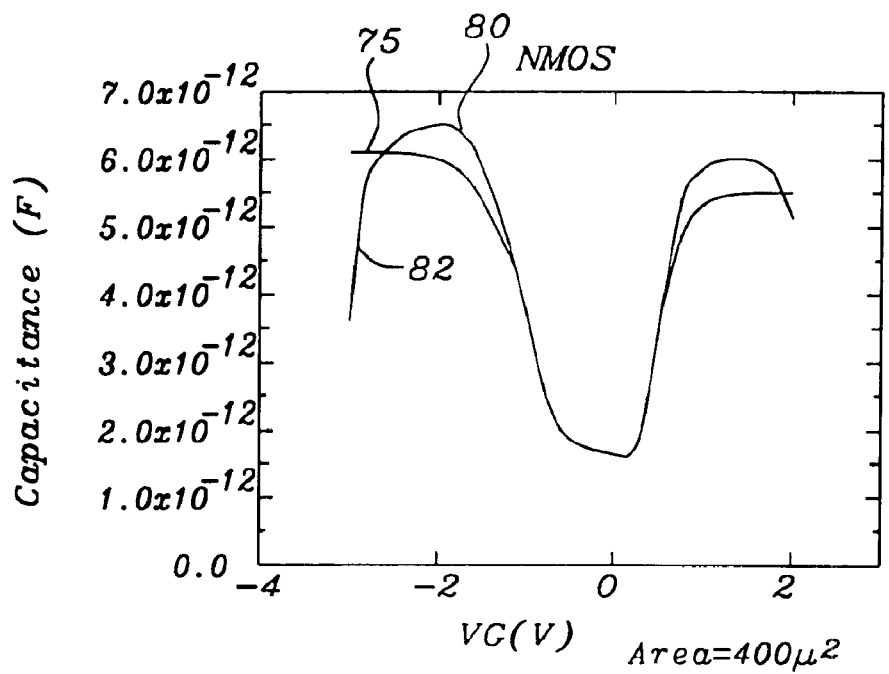
FIG. 2a – Prior Art
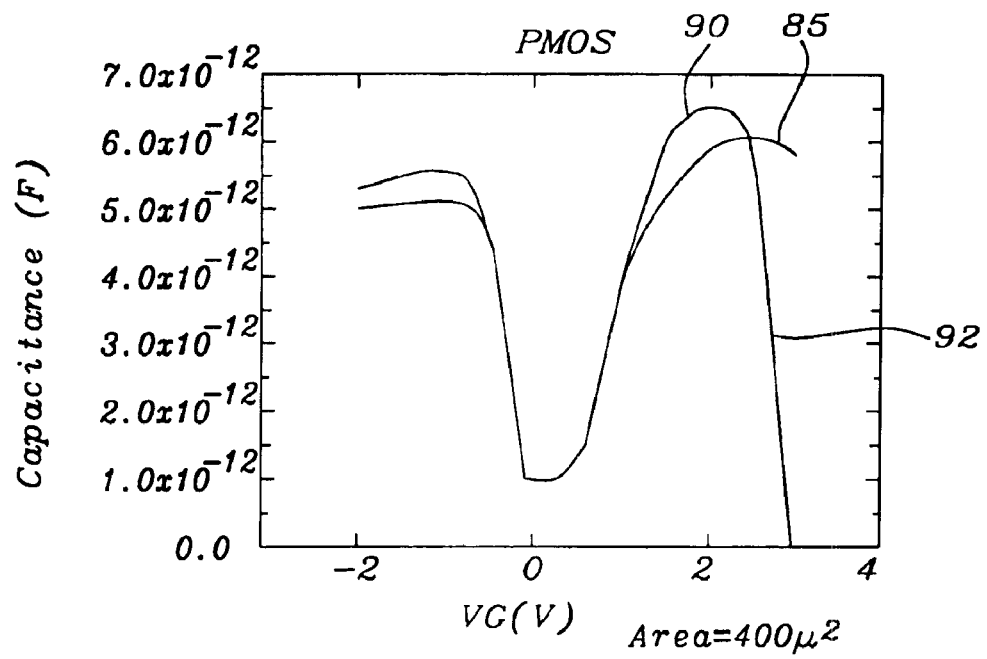
FIG. 2b – Prior Art

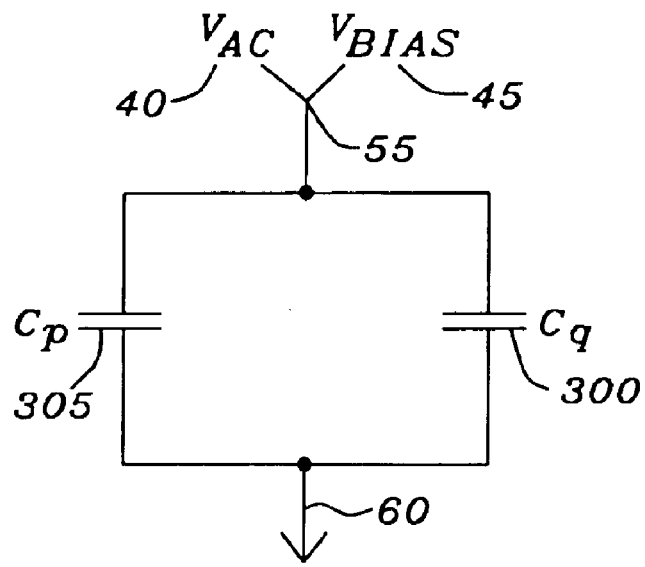
FIG. 6a – Prior Art
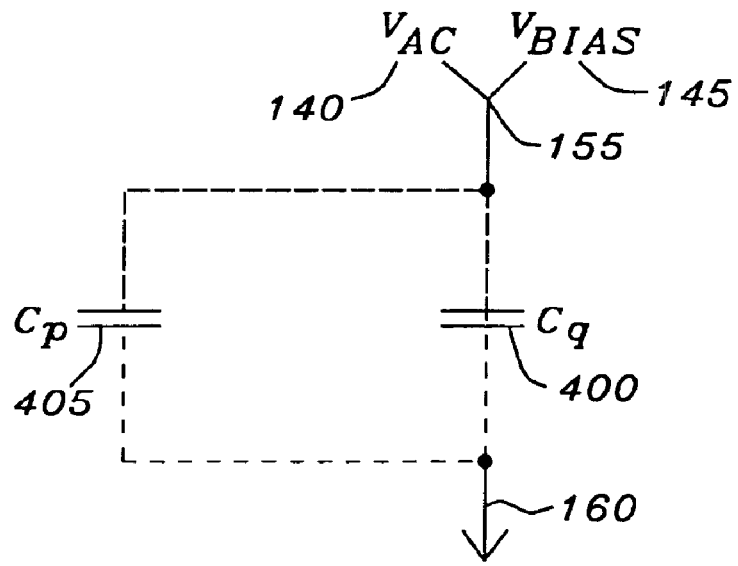
FIG. 6b

METHOD FOR MEASURING CAPACITANCE-VOLTAGE CURVES FOR TRANSISTORS

BACKGROUND OF THE INVENTION

1. Field of the Invention

This present invention relates generally to metal insulator semiconductor (MIS) devices. More particularly, the present invention relates to systems and methods for determining the capacitance versus voltage of dielectric materials forming the gate insulation structure of the MIS devices. Even more particularly, the present invention relates to circuits and systems for determining from the capacitance versus voltage the thickness of ultra-thin gate oxides of a metal oxide semiconductor (MOS) transistor.

2. Description of Related Art

Characterization of MOS transistors is critical to the verification of the manufacturing process design to the resulting integrated circuits. Capacitance-voltage measurement is fundamental to determining the device characteristics of the MOS transistors.

As the manufacturing processes are improved, the device sizes of the MOS transistors are decreasing and the gate insulation or gate oxide is becoming thinner. The gate capacitance thus is becoming more difficult to determine. The thinner insulator of the MOS device results in the direct tunneling leakage current increasing exponentially and the parasitic capacitances of the MOS device no longer being able to be ignored.

Refer now to FIG. 1 for a review of the test structure of the prior art for determining the capacitance of the insulating structure of a MOS device versus an applied voltage. The test structure in this case is essentially a MOS capacitor formed of a MOS transistor having the gate as the one plate of the capacitor, the gate oxide as the insulator, and the source, drain, and the intervening channel as the second plate. A substrate 3, generally a lightly doped semiconductor crystalline wafer, has a well 5 formed with lightly doped impurities to act as a bulk semiconductor the for the test structure. Shallow trench isolation regions 15 are formed in the surface of the substrate 3 within the well area 5 to demarcate the test structure. A well pick-up contact 20 is formed in the well area 5 by diffusion of heavily doped impurities of the same polarity as the well area 5 to provide a low resistivity path for connection to the well area 5. A source/drain region 10 are formed by a diffusion of a heavily doped impurity of a polarity opposite that of the well are 5 adjacent to the shallow trench isolation regions 15.

A gate oxide 25 is constructed at the surface of the substrate in the area above the well 5 and between and overlapping the source/drain region 10. A conductive gate 30 is formed of highly doped polycrystalline silicon on the surface of the gate oxide 25 above the well 5 and between and overlapping the source/drain region 10.

*The Agilent Technologies Impedance Measurement Handbook*, Application Note 5950, staff, Agilent Technologies Co. Ltd., Palo Alto, Ac 943303, copyright 2000, pp. 5–12–5–14, illustrates a capacitance-voltage test system 35. The capacitance voltage system 35 has an AC voltage source 40 and a DC biasing voltage source 45 that are added to form the stimulus that is applied through the stimulus terminals 50 and 55 to the source/drain region 10 and the well pick-up 20. The sense terminal 60 is connected to the gate 30 to provide a return path for the currents of generated by the stimulus voltages. The voltage meter 65 is connected between the stimulus terminal 55 and the sense terminal 60 to measure the voltage developed across the test structure. The current meter 70 is connected to terminal 60 and the ground reference terminal to sense the current flowing through the test structure. The voltage meter 65 and the current meter 70 are capable of measuring the AC amplitude and phase to determine the capacitance of the test structure. The DC biasing voltage source 45 is swept to force the channel area 22 beneath the gate oxide 25 to be forced from the accumulation of the majority carriers in the channel area 22, to a depletion of the majority carriers in the channel area 22, to an inversion to accumulate the minority carriers of the channel area 22. The voltmeter 65 and the current meter 70 readings are logged for each voltage of the biasing voltage source 45 based on the frequency of the AC voltage source 40. The capacitance is determined for each biasing level.

Referring to FIG. 6a for an illustration of the equivalent circuit for the structure of the prior art. The MOS capacitor formed of the MOS transistor is represented as the capacitor $C_g$ 300 and the parasitic capacitance is represented by the capacitor $C_p$ 305. The AC voltage source 40 and the DC biasing voltage source 45 are added and applied to the terminal 55. In the structure of the prior art as shown the parasitic capacitor $C_p$ 305 can not be easily eliminated in the determination of the MOS capacitance $C_g$ 300 formed of the MOS transistor. The MOS capacitor $C_g$ 300 and the parasitic capacitance $C_p$ 305 are connected to the sense terminal 60 to receive the current generated by the voltages of the AC voltage source 40 and the DC biasing voltage source 45 applied to the terminal 55. As shown, the measured capacitance is the sum of the capacitances of the MOS capacitor $C_g$ 300 and the parasitic capacitor $C_p$ 305.

Refer now to FIGS. 2a and 2b for a discussion of the effects of the thickness of the gate oxide 25 of FIG. 1. FIG. 2a illustrates the gate capacitance of the test structure, where the test structure represents an NMOS transistor having a p-type well 5. FIG. 2b illustrates a gate capacitance of the test structure, where the test structure represents a PMOS transistor having an n-type well 5. The area of the test structure of FIGS. 2a and 2b used to determine the gate capacitance is approximately 400 $\mu m^2$. For test structures having gate oxide 25 of approximately 20 Å, the capacitance 75 of the NMOS device of FIG. 2a remains consistent across the range of DC biasing voltage applied to the source/drain region 10 and the well pickup 20. However, for a gate oxide 25 of 17 Å, the capacitance 80 shows a distortion 82 resulting from the dominance of the large gate leakage current.

Similarly, for the PMOS device of FIG. 2b, where the test structures have a gate oxide 25 of approximately 20 Å, the capacitance 85 of the remains consistent across the range of DC biasing voltage applied to the source/drain region 10 and the well pick-up 20. However, for a gate oxide 25 of 17 Å, the capacitance 90 shows a distortion 92 resulting from the large gate leakage current.

To minimize the effects of the larger leakage current because of the thinner oxide, the test structure is made smaller (<100 $\mu m^2$). This causes a further inaccuracy in the measurement of the gate capacitance since the parasitic capacitances now begin to dominate.

U.S. Pat. No. 6,472,236 (Wang, et al.) describes a system and method for determining an effective oxide thickness for each of first and second dielectric structures that form a MOS (metal oxide semiconductor) stack. Test MOS stacks are formed with each MOS stack having a dielectric structure comprised of a stack of two dielectric materials. The time for deposition of the first dielectric material is varied in the formation of the MOS stacks while the second dielectric material is maintained to be substantially constant for the test MOS stacks. A total effective oxide thickness is measured for each of the MOS stacks. A first graph having total effective oxide thickness as a first axis and having deposition time for forming the first dielectric structure as a second axis is generated by plotting the respective total effective oxide thickness versus the respective deposition time for forming the first dielectric material for each of the test MOS stacks. The respective second effective oxide thickness of the respective second dielectric structure that is substantially same for each of test MOS stacks is determined from an intercept of the first axis of total effective oxide thickness when deposition time for forming the first dielectric material of the second axis is substantially zero in the first graph.

U.S. Pat. No. 6,456,105 (Tao) describes a method for determining the electrical thickness of a very thin gate oxide layer of a MOS transistor that is subject to relatively high leakage current owing to its thinness includes measuring first and second frequency-dependent capacitances $C_1$, $C_2$ and then using the capacitances to render a corrected capacitance. The electrical thickness is then determined the corrected capacitance, to render a comparatively more accurate value of gate oxide electrical thickness $T_{ox}$.

U.S. Pat. No. 5,485,097 (Wang) illustrates a method of electrically measuring a thin oxide thickness by tunnel voltage. A predetermined value of current density is applied through the device under test. The voltage developed across the device under test is measured and the oxide electrical thickness is calculated through a predetermined calibration curve.

"MOS Capacitance Measurements for High-Leakage Thin Dielectrics," Yang et al., IEEE Transactions On Electron Devices, VOL. 46, NO. 7, July 1999, pp. 1500–1501, presents a technique, which allows the frequency-independent device capacitance to be accurately extracted from impedance measurements at two frequencies.

"MOS C-V Characterization of Ultra-thin Gate Oxide Thickness (1.3–1.8 nm)," Choi et al., IEEE Electron Device Letters, VOL. 20, NO. 6, JUNE 1999, pp. 292–294, describes an equivalent circuit approach to MOS capacitance-voltage (C-V) modeling of ultra-thin gate oxides (1.3–1.8 nm). Capacitance simulation including polysilicon depletion is based on quantum mechanical (QM) corrections implemented in a two-dimensional (2-D) device simulator, tunneling current is calculated using a one-dimensional (1-D) Green's function solver. The sharp decrease in capacitance observed for gate oxides below 2.0 nm in both accumulation and inversion is modeled using distributed voltage-controlled RC networks. The imaginary components of small-signal input admittance obtained from AC network analysis agree well with measured capacitance.

U.S. Pat. No. 5,793,675 (Cappelletti, et al.) describes a method for evaluating the gate oxide of non-volatile EPROM, EEPROM and flash-EEPROM memories. The method employs a test structure that identical to the memory array whose gate oxide quality is to be determined. The cells of the test structure are connected electrically parallel to one another. The test structure is so stressed electrically as to extract electrons from the floating gate of the defective-gate-oxide cells and so modify the characteristic of the defective cells while leaving the charge of the non-defective cells unchanged. In this way, only the threshold of the defective cells is altered. A sub-threshold voltage is then applied to the test structure, and the drain current through the cells, which is related to the presence of at least one defective cell in the structure, is measured. Measurement and analysis of the current-voltage characteristic provides for determining the number of defective cells.

U.S. Pat. No. 6,066,952 (Nowak, et al.) demonstrates a method for measurement of a width of an undoped or lightly doped polysilicon line. The width measuring method includes generating a current in the polysilicon line with an energy source. The capacitance between the polysilicon line and a substrate separated from the polysilicon line by a dielectric layer is then measured. The line width of the polysilicon line is then determined from the measured capacitance.

U.S. Pat. No. 6,339,339 (Maeda) describes a method for evaluating the reliability of a thin film transistor (TFT), time coefficient, voltage coefficient and temperature coefficient are experimentally produced from negative bias thermal stress tests. The life of a TFT under negative bias thermal stress conditions is then evaluated.

U.S. Pat. No. 6,472,233 (Ahmed, et al.) teaches a MOS transistor test structure for capacitance-voltage measurements. The capacitance voltage measurements are employed for extracting polysilicon gate doping. The capacitance-voltage measurements analyze the test structure in strong inversion.

U.S. Pat. No. 6,011,404 (Ma, et al.) reveals a system and method for determining near-surface lifetimes and the tunneling field of a dielectric in a semiconductor.

SUMMARY OF THE INVENTION

An object of this invention is to provide a test structure for measuring the capacitance of a metal-insulator-semiconductor structure.

Another object of this invention is to provide a method for determining the capacitance of the test structure for measuring the capacitance of the metal-insulator-semiconductor structure.

Further, another object of this invention is to provide a test structure for the measurement of the electrical insulation thickness of such insulations as the gate oxide of a MOS transistor.

Still further, another object of this invention is to provide a method for measuring the electrical thickness of the insulations such as the gate oxide of a MOS transistor.

To accomplish at least one of these objects, a system for characterizing an insulating layer constructed between a conductive gate layer and a substrate has at least one test structure formed at a surface of a substrate. Each test structure has a bulk region formed of a semiconductor within the surface. Further the test structure has at least one source region within the bulk region and at least one drain region within the bulk region such that each drain region is placed at a distance from one of the source regions. A thin insulating layer is placed above the each source region, each drain region, and the bulk region between the source region and the drain region. A conductive gate layer is placed above the thin insulating layer.

The system has a capacitance-voltage measuring device. The capacitance-voltage measuring device has a stimulus probe in contact the source region and the drain region of each test structure, a sense probe in contact with the conductive gate layer of each test structure to measure a capacitance value of the test structure. The capacitance-voltage measuring device has a bulk biasing probe connected to the bulk region between the source region and the drain region. The capacitance-voltage measuring device varies a first voltage between the source/drain regions and the conductive gate layer to force the test structure into an inversion state. The bulk biasing probe is either floated or attached to a second voltage to insure that the test structure is in the inversion state. The capacitance-voltage measuring device measures the gate capacitance value of the test structure for each value of the voltage at the conductive gate layer.

The system includes an insulating layer thickness calculator in communication with the capacitance-voltage measuring device to receive the capacitance as measured and from the capacitance determine the thickness of the insulating layer.

The bulk biasing probe is able to force the second voltage and thus bulk region to a voltage level equal to that of the first voltage level and the capacitance-voltage measuring device measures a second capacitance of the test structure. The parasitic capacitance of the test structure is determined as a difference between the second capacitance and the first capacitance.

The test structure has an area of less than 1,000 $\mu m^2$ prevent the excess leakage current from the thin oxide, which has a thickness is less than 22 Å. Preferably the test structure has an area of less than 1,000 $\mu m^2$.

BRIEF DESCRIPTION OF THE DRAWINGS

FIG. 1 is a cross sectional diagram of a test structure for determining the capacitance and gate oxide thickness of a metal-insulator-semiconductor structure of the prior art FIGS. 2a and 2b are plots of the capacitance versus the voltage applied to the conductive gate layer of FIG. 1.

FIG. 6a is a schematic diagram of an equivalent circuit of the test structure of the prior art FIG. 6b is a schematic diagram of an equivalent circuit of the test structure of this invention.

DETAILED DESCRIPTION OF THE INVENTION

As described above, the improved manufacturing process permits device sizes of the MOS transistors to decrease with gate oxide becoming on the order of a few tens of molecules thick. The thinner insulator of the MOS device results in the direct tunneling leakage current increasing exponentially and the parasitic capacitances of the MOS device no longer being able to be ignored. To decrease the amplitude of the direct tunneling leakage current, the size of test structures used to evaluate the properties of the gate oxide (capacitance, thickness, etc.) are made smaller. These structures are constructed on the order of 100 $\mu m^2$, however, with scaling this small the parasitic capacitances of the test structure begin to dominate with test structures of the prior art.

Figure 3:
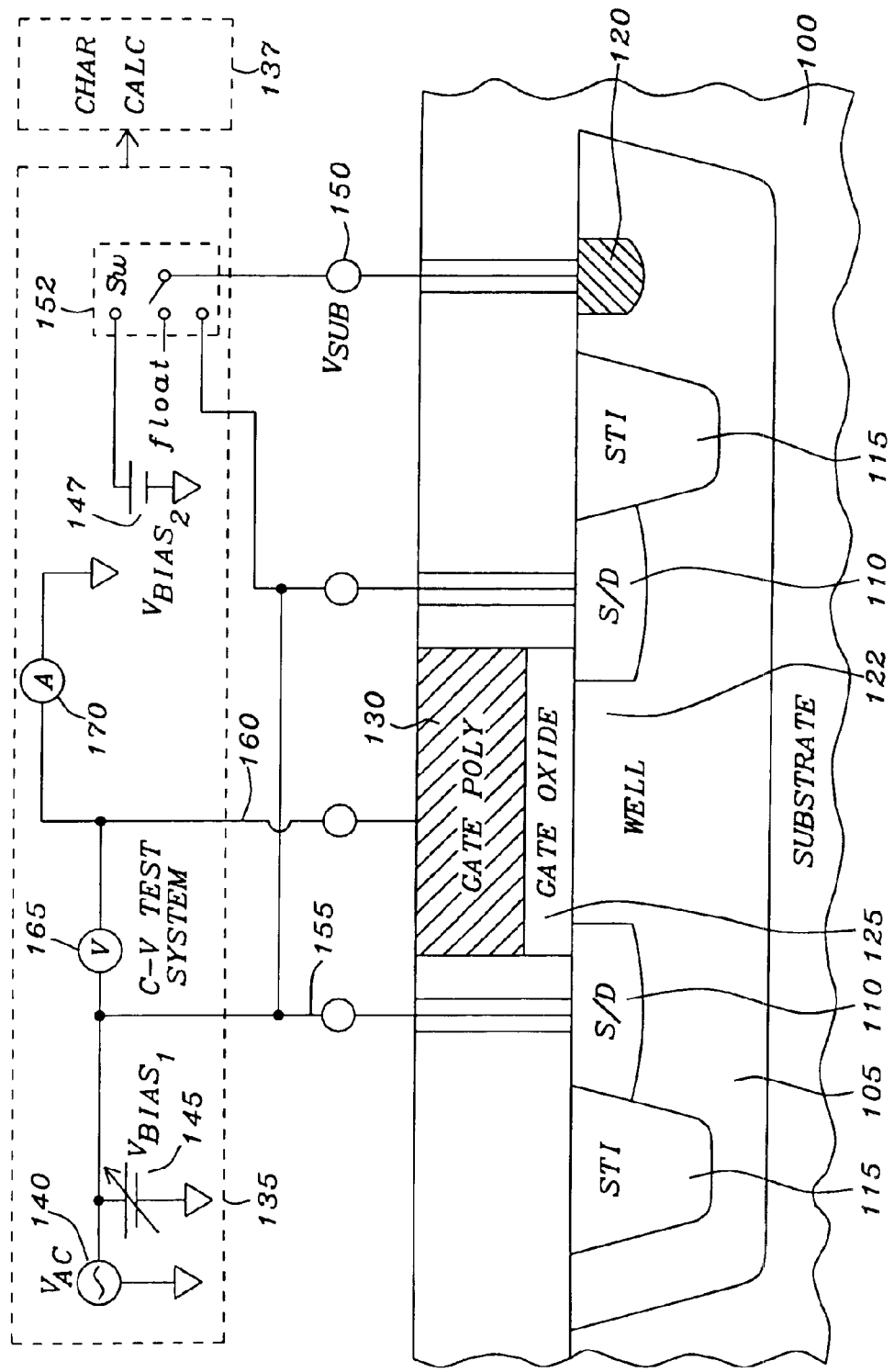
FIG. 3 is a cross sectional diagram of a test structure for determining the capacitance and insulator thickness of a metal-insulator-semiconductor structure of this invention.

Refer now to FIG. 3 for a discussion of the test structure of this invention for characterizing the insulating structure of a MOS device. The test structure in this case is essentially a MOS transistor having the gate oxide as the insulator, a gate on the gate oxide, a source, and a drain. A substrate 100, generally a lightly doped semiconductor crystalline wafer, has a well 105 to act as a bulk semiconductor the for the test structure. Shallow trench isolation regions 115 are formed in the surface of the substrate 100 within the well area 105 to demarcate the test structure. A well pick up 120 is formed in the well area 105 of a heavily doped impurity having the polarity of the well area 105 to provide a low resistivity path for connection to the well area 105. A source/drain region 110 are formed by heavily doped impurities having a polarity opposite that of the well area 105 adjacent to the shallow trench isolation regions 115.

A gate oxide 125 is constructed at the surface of the substrate in the area above the well 105 and between and overlapping the source/drain region 110. A conductive gate 130 is formed of highly doped polycrystalline silicon on the surface of the gate oxide 125 above the well 110 and between and overlapping the source/drain region 110.

The capacitance voltage system 135 has an AC voltage source 140 and a DC biasing voltage source 145 that are the stimulus that is applied through the stimulus terminal 155 to the source/drain region 110. The sense terminal 160 is connected to the conductive gate 130 to provide a current return path for the biasing voltages for the test structure. The voltage meter 165 is connected between the stimulus terminal 155 and the sense terminal 160 to measure the voltage developed across the test structure. The current meter 170 is connected to sense terminal 160 and the ground reference terminal to sense the current flowing through the test structure. The voltage meter 165 and the current meter 170 are capable of measuring the AC amplitude and phase to determine the capacitance of the test structure.

The well area 105 through the well pick up 120 is in contact with a substrate voltage supply terminal 150. The substrate voltage supply terminal 150 is connected to the switch 152 such that the well area 105 is optionally floating with no electrical contact or to a second voltage biasing source 147 or is connected to the AC voltage source 140 and the DC biasing voltage source 145.

Referring to FIG. 6b for an illustration of the equivalent circuit for the structure of this invention. The MOS capacitor formed of the MOS transistor is represented as the capacitor $C_g$ 400 and the parasitic capacitance is represented by the capacitor $C_p$ 405. The AC voltage source 140 and the DC biasing voltage source 145 are added and applied to the terminal 155. In the structure of the prior art, as shown in FIG. 6a, the parasitic capacitor $C_p$ 305 can not be easily eliminated in the determination of the MOS capacitance $C_g$ 300 formed of the MOS transistor. In FIG. 6b, the MOS capacitor $C_g$ 400 and the parasitic capacitance $C_p$ 405 are connected to the sense terminal 160 to receive the current generated by the voltages of the AC voltage source 140 and the DC biasing voltage source 145 applied to the terminal 155.

Initially, the switch 152 of FIG. 3 connects the AC voltage source 140 and the DC biasing voltage source 145 to the substrate voltage supply terminal and thus to the well area 120. The DC biasing voltage source 145 is swept to force the channel area 122 beneath the gate oxide 125 to be forced from the accumulation of the majority carriers in the channel area 122, to a depletion of the majority carriers in the channel area 122, and to an inversion to accumulate the minority carriers of the channel area 122. The voltmeter 165 and the current meter 170 readings are logged for each voltage of the biasing voltage source 145 based on the frequency of the AC voltage source 140. Each of the logged readings is transferred to the characteristic calculator 137. The capacitance is determined by the characteristic calculator 137 for each biasing level as a function of the measured current and voltage based on the frequency of the AC voltage source 140. As connected, the measured capacitance is the sum of the capacitances of the MOS capacitor $C_g$ 400 and the to parasitic capacitor $C_p$ 405.

The switch 152 is then set to float the well area 105 through the well pick up 120 and the DC biasing voltage source 145 is swept to force the channel area 122 to inversion in the channel area 122. The voltmeter 165 and the current meter 170 readings are logged and transferred to the characteristic calculator 137 for each voltage of the biasing voltage source 145 based on the frequency of the AC voltage source 140. The capacitance is determined by characteristic calculator 137 for each biasing level as a function of the measured current and voltage based on the frequency of the AC voltage source 140. With the well pick up 120 floating, the capacitance determined excludes the parasitic capacitance $C_p$ and only measures the MOS capacitor $C_g$ 400.

The characteristic calculator 137 then calculates the parasitic capacitance $C_p$ as the difference of sum of the capacitances of the MOS capacitor $C_g$ 400 and the parasitic capacitor $C_p$ 405 (well connected) and the capacitance of the MOS capacitor $C_g$ 400 (well floating). This calculation is done for biasing the MOS transistor in inversion. The MOS capacitor $C_g$ 400 in accumulation is then computed by subtracting the calculated parasitic capacitance $C_p$ from the sum of the capacitances of the MOS capacitor $C_g$ 400 and the parasitic capacitor $C_p$ 405 in the accumulation mode.

Alternately, the well area 105 through the well pick up 120 is connected to the second biasing voltage source 147. The second biasing voltage source 147 has a level that insures that the channel area 122 is forced into inversion. The DC biasing voltage source 145 is swept to further force the channel area 122 to inversion in the channel area 122. The voltmeter 165 and the current meter 170 readings are logged and transferred to the characteristic calculator 137 for each voltage of the biasing voltage source 145 based on the frequency of the AC voltage source 140. The capacitance is determined by characteristic calculator 137 for each biasing level as a function of the measured current and voltage based on the frequency of the AC voltage source 140. With the well pickup 120 floating, the capacitance determined excludes the parasitic capacitance $C_p$ and only measures the MOS capacitor $C_g$ 400.

The characteristic calculator 137 then calculates the parasitic capacitance $C_p$ as the difference of sum of the capacitances of the MOS capacitor $C_g$ 400 and the parasitic capacitor $C_p$ 405 (well connected) and the capacitance of the MOS capacitor $C_g$ 400 (well at second biasing voltage). This calculation is done for biasing the MOS transistor in inversion. The MOS capacitor $C_g$ 400 in accumulation is the n computed by subtracting the calculated parasitic capacitance $C_p$ from the sum of the capacitances of the MOS capacitor $C_g$ 400 and the parasitic capacitor $C_p$ 405 in the accumulation mode.

Once the capacitance of MOS capacitor $C_g$ 400 is determined the thickness of the gate oxide 125 is calculated by characteristic calculator 137 with the equation:

$$t_{ox} = \frac{C_{ox}}{\varepsilon_{ox}}$$

$t_{ox}$ is the thickness of the gate oxide 125.

$C_{ox}$ is the measured capacitance between the conductive gate 130 and the channel area 122 of the well region 105.

$E_{ox}$ is the dielectric constant of the gate oxide 125.

It is apparent that as the DC biasing voltage source 145 is swept through the voltages that have the test structure in the accumulation and depletion of the majority carriers, the capacitance as measured is very small. The capacitance as measured is resulting from the area of overlap from the source/drain region 110. As the channel region 122 enters the inversion state, the charges of the minority carriers collect at the surface of the channel region 122 and the capacitance measured is the total capacitance of the conductive gate 130, the gate oxide region 125, and the channel region 122 with the overlap of the source/drain region 110. The parasitic capacitances of the interconnection and the bonding pads are thus eliminated from the measurement of the test structure. These parasitic capacitances are eliminated because the parasitic capacitances are isolated with the floating well area 105 and do not respond to the stimulus of the AC voltage source 140.

Figure 4A:
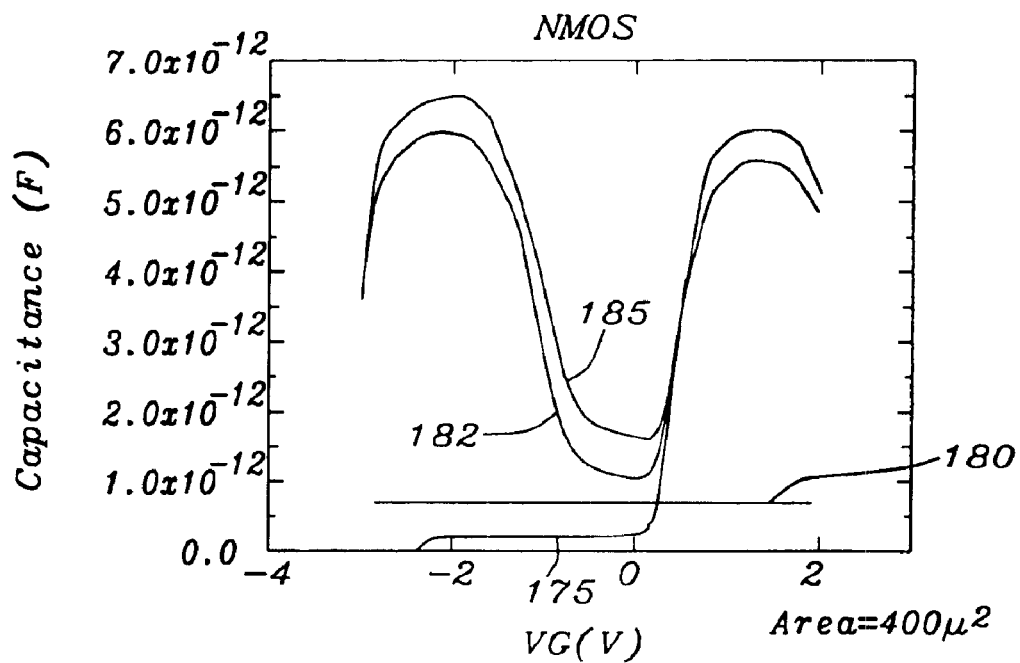
FIGS. 4a and 4b are plots of the capacitance versus the voltage applied to the conductive gate layer of FIG. 3.
Figure 4B:
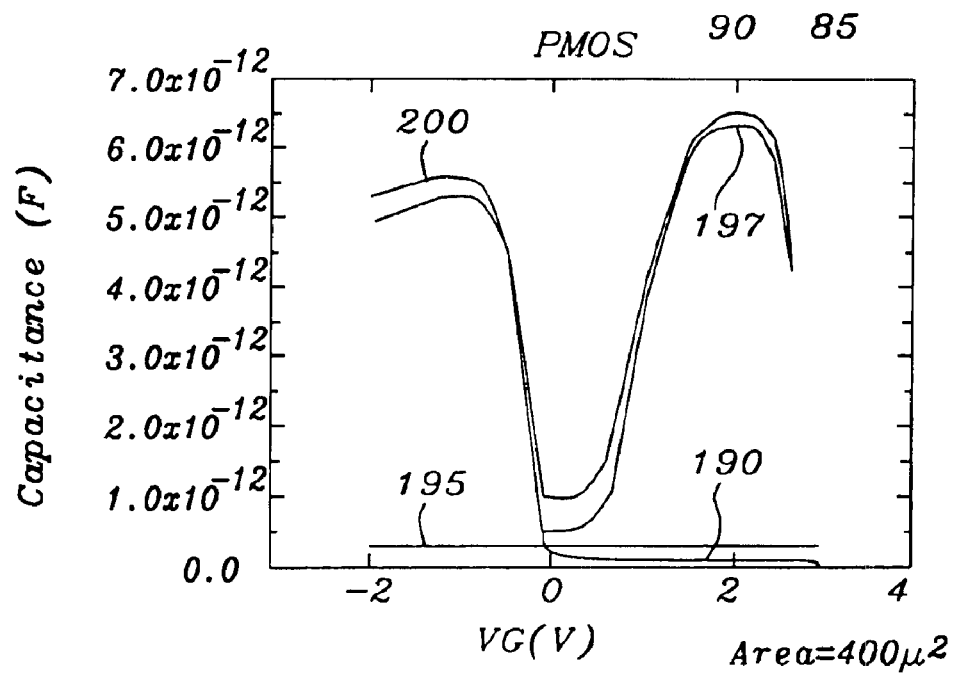

Refer now to FIGS. 4a and 4b for a discussion of the effects of the thickness of the gate oxide 125 of FIG. 3. FIG. 4a illustrates the gate capacitance of the test structure, where the test structure represents an NMOS transistor having a p-type well 105 and n-type diffusion for the source/drain region 110. FIG. 4b illustrates a gate capacitance of the test structure, where the test structure represents a PMOS transistor having an n-type well 105 and p-type diffusion for the source/drain region 110. The area of the test structure of FIGS. 4a and 4b used to determine the gate capacitance is approximately 400 $\mu m_2$.

The plot of capacitance 175 of FIG. 4a represents the measurement of the capacitance as described in FIG. 3. with the well 105 floating. The plot 180 is a plot of the "dummy" or parasitic capacitance of the interconnections and the bonding pads. In the method of the prior art the total capacitance determined is the sum of the capacitance of the test structure and the parasitic or "dummy" capacitance.

The plot of the capacitance 185 shows the results of measurement of the capacitance where the well 105 is connected to a substrate voltage source that placed at a voltage level equal to that of the AC voltage source 140. As is apparent, the capacitance with the well 105 placed at the voltage level of the AC voltage source 140, has a measurement that is equivalent to that of the prior art. The resulting capacitance is shown in the plot 182 where the value of the "dummy" capacitance is subtracted from the measured capacitance of the plot 185. The resulting capacitance is equivalent to the measured capacitance shown in the plot 175 when the test structure of FIG. 3 is in full inversion.

The plot of capacitance 190 of FIG. 4b represents the measurement of the capacitance as described in FIG. 3. with the well 105 floating. The plot 195 is a plot of the "dummy" capacitance.

The plot of the capacitance 200 shows the results of measurement of the capacitance where the well 105 is connected to a substrate voltage source that placed at the voltage level equal to that of the AC voltage source 140. As is apparent, the capacitance with the well 105 placed at the voltage level of the AC voltage source 140, has a measurement that is equivalent to that of the prior art. The resulting capacitance is shown in the plot 182 where the value of the "dummy" capacitance is subtracted from the measured capacitance of the plot 200. The resulting capacitance is equivalent to the measured capacitance shown in the plot 190 when the test structure of FIG. 3 is in full inversion.

It should be further noted that the parasitic capacitance of the test structure as described in FIG. 3 can be determined by the subtraction of the plot of capacitance 175 subtracted from the plot of capacitance 185 in FIG. 4*a*. Similarly, the parasitic capacitance of FIG. 4*b* is determined by subtracting the plot of capacitance 190 from the capacitance 200. This allows for the characterization of the NMOS and PMOS transistors as manufactured with the technology in which the test structure of FIG. 3 is formed.

Figure 5:
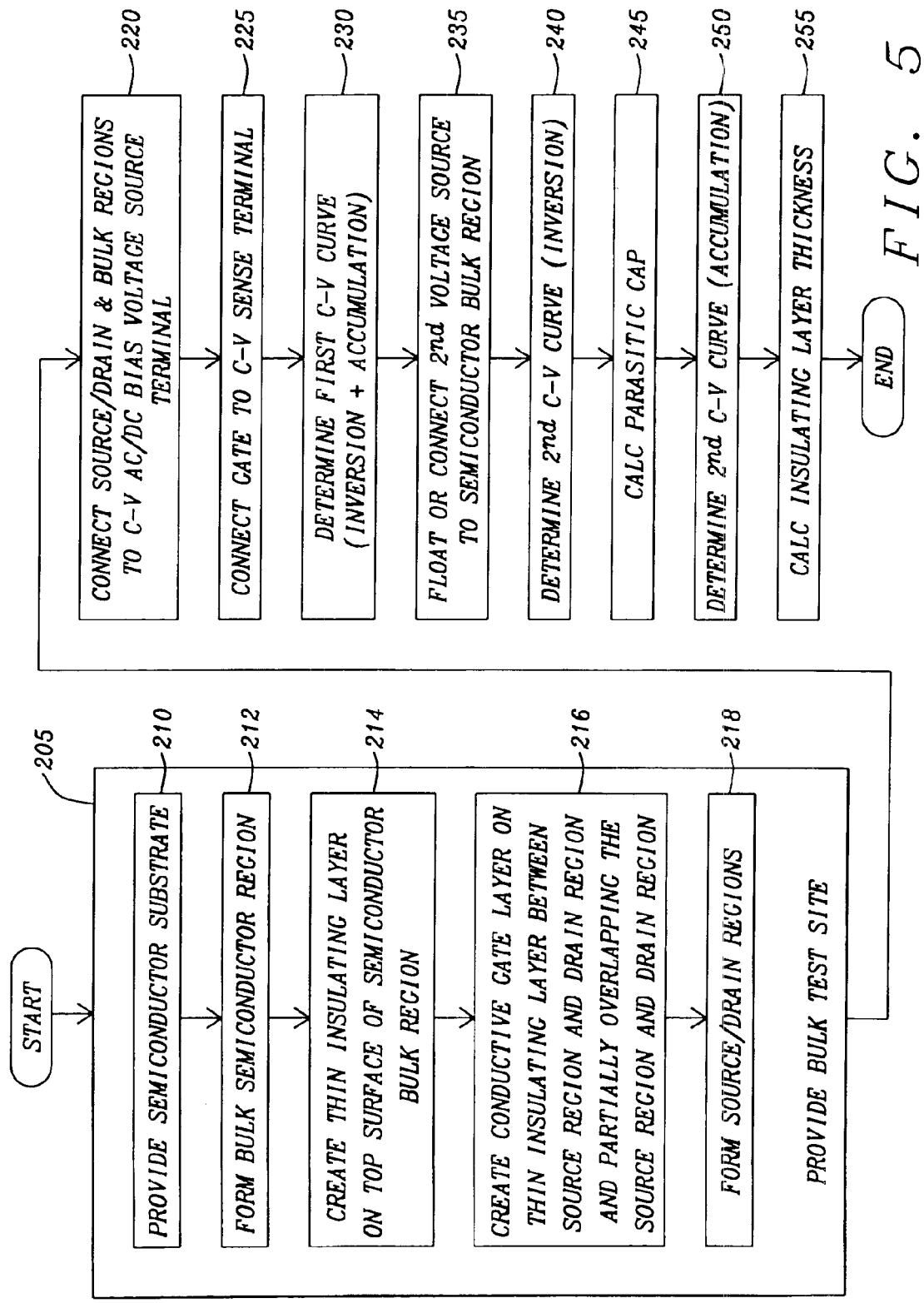
FIG. 5 is a flow diagram for the method for determination of the capacitance and the insulator thickness of the test structure of this invention.

In summary and referring to FIG. 5, the test structure of this invention provides a method for determining the gate oxide capacitance of a MOS transistor. The test site is provided (Box 205) as is described in FIG. 3. The test site is formed on a provided (Box 210) substrate. A bulk semiconductor well region is formed (Box 212) in the surface of the substrate. A thin insulation is created (Box 214) at the surface of the substrate between and slightly overlapping the source region and the drain region. A conductive gate region is placed (Box 216) on the thin insulation. The conductive gate is placed to be between and overlapping the source region and the drain region. The source region and drain region are formed (Box 218) in the surface of the substrate within the bulk semiconductor well region and adjacent to shallow trench isolation that demarcates the test site within the bulk semiconductor well region.

Once the test site is provided (Box 205), the source/drain region and the bulk semiconductor well region are connected (Box 220) to the AC voltage source and DC bias voltage source terminal of the capacitance to voltage measurement system. The conductive gate region is connected (Box 225) to the sense terminal of the capacitance-voltage measurement system. A first capacitance-voltage curve is determined (Box 230) by sweeping the DC bias voltage source to force the channel area beneath the gate oxide from the accumulation of the majority carriers in the channel area, to a depletion of the majority carriers in the channel area, and to an inversion to accumulate the minority carriers of the channel area.

The semiconductor bulk well region is then floated or connected (Box 235) to a second voltage source to insure that the semiconductor bulk well is in inversion. A second capacitance-voltage curve is then determined (Box 240) by sweeping the DC bias voltage source such that the channel are in inversion. Voltmeter and current meter readings are logged for each voltage of the bias voltage source. The capacitance at each of the DC bias voltage source levels is then calculated based on the frequency of the AC voltage source.

The parasitic capacitance $C_p$ is determined (Box 245) as the difference of sum of the capacitances of the MOS capacitor $C_g$ and the parasitic capacitor $C_p$ (well connected) and the capacitance of the MOS capacitor $C_g$ (well floating). This calculation is done for biasing the MOS transistor in inversion. The MOS capacitor $C_g$ in accumulation is then computed (Box 250) by subtracting the calculated parasitic capacitance $C_p$ from the sum of the capacitances of the MOS capacitor $C_g$ and the parasitic capacitor $C_p$ in the accumulation mode. From the measured capacitance the electrical oxide thickness is then calculated (Box 250) according the above equation.

While this invention has been particularly shown and described with reference to the preferred embodiments thereof, it will be understood by those skilled in the art that various changes in form and details may be made without departing from the spirit and scope of the invention.

The invention claimed is:

1. An apparatus for characterizing an insulating layer constructed between a conductive gate and a substrate, comprising:

at least one test structure formed at a surface of a substrate, each test structure comprising:
a bulk region formed of a semiconductor within said surface,
at least one source region within the bulk region,
at least one drain region within the bulk region such that each drain region is placed at a distance from one of the source regions,
a thin insulating layer placed above the each source region, each drain region, and the bulk region between said source region and said drain region, and
the conductive gate placed above the thin insulating layer, and a capacitance-voltage measuring device having a sense probe in contact the conductive gate of each test structure, a stimulus probe in contact with the source and drain region of each test structure to measure a capacitance value of said test structure, and a bulk biasing probe to force said bulk region between said source and drain region to a second voltage level, whereby said second voltage level forces said bulk region to an inversion, said capacitance-voltage measuring device varying a first voltage at said source and drain region to force said test structure into the inversion state and measuring a first capacitance of said test structure.

2. The apparatus of claim 1 further comprising an insulating layer thickness calculator in communication with the capacitance-voltage measuring device to receive the capacitance as measured and from said capacitance determine the thickness of said insulating layer.

3. The apparatus of claim 1 wherein the bulk biasing probe forces the bulk region to the second voltage level equal to said first voltage and said capacitance-voltage measuring device measures a second capacitance of said test structure, a parasitic capacitance of said test structure being a difference between the second capacitance and the first capacitance.

4. The apparatus of claim 1 wherein the test structure has an area of less than 10,000 $\mu m^2$.

5. The apparatus of claim 1 wherein the test structure has an area of less than 1,000 $\mu m^2$.

6. The apparatus of claim 1 wherein the insulating layer thickness is less than 22 Å.

7. A apparatus for determining thickness of an insulating layer constructed between a conductive gate and a substrate, comprising:

at least one test structure formed at a surface of a substrate, each test structure comprising:
a bulk region formed of a semiconductor within said surface,
at least one source region within the bulk region,
at least one drain region within the bulk region such that each drain region is placed at a distance from one of the source regions,
a thin insulating layer placed above the each source region, each drain region, and the bulk region between said source region and said drain region, and
the conductive gate placed above the thin insulating layer, a capacitance-voltage measuring device having a sense probe in contact the source region and the drain region of each test structure, a stimulus probe in contact with the source and drain region of each test structure to measure a capacitance value of said test structure, and a bulk biasing probe to force said bulk region between said source a nd drain region, said capacitance-voltage measuring device varying a first voltage level between said stimulus probe and said sense probe said bulk biasing probe to a second voltage level to force said test structure into an inversion state and measuring a first capacitance of said test structure; and an insulating layer thickness calculator in communication with the capacitance-voltage measuring device to receive the capacitance as measured and from said capacitance, determines the thickness of said insulating layer.

8. The apparatus of claim 7 wherein the bulk biasing probe forces the bulk region to the second voltage level to be equal to said first voltage and said capacitance-voltage measuring device measures a second capacitance of said test structure, a parasitic capacitance of said test structure being a difference between the second capacitance and the first capacitance.

9. The apparatus of claim 7 wherein the test structure has an area of less than 10,000 $\mu m^2$.

10. The apparatus of claim 7 wherein the test structure has an area of less than 1,000 $\mu m^2$.

11. The apparatus of claim 7 wherein the insulating layer thickness is less than 22 Å.

12. A method for characterizing an insulating layer constructed between a conductive gate and a substrate, comprising the steps of:

forming at least one test structure at a surface of a substrate by the steps of:
  forming a bulk region of a semiconductor within said surface,
  creating at least one source region within the bulk region,
  creating at least one drain region within the bulk region such that each drain region is placed at a distance from one of the source regions,
  constructing a thin insulating layer above the each source region, each drain region, and the bulk region between said source region and said drain region, and
  placing the conductive gate above the thin insulating layer; and performing a capacitance-voltage measurement by the steps of:
  connecting the source region with the drain region of each test structure,
  placing a sense probe in contact the conductive gate of each test structure,
  placing a stimulus probe in contact with the source and drain region of each test structure to measure a capacitance value of said test structure,
  varying a first voltage between said stimulus probe and said sense probe to force said test structure into an inversion state,
  placing a bulk biasing probe in contact with said bulk region to force said bulk region between said source and drain region to a second voltage to insure said inversion state, and
  measuring a first capacitance of said test structure.

13. The method of claim 12 further comprising the step of: determining the thickness of said insulating layer from said first capacitance.

14. The method of claim 12 further comprising the steps of:
  forcing the bulk region the second voltage level equal to said first voltage, and
  measuring a second capacitance of said test structure,
  calculating a parasitic capacitance of said test structure as a difference between the second capacitance and the first capacitance.

15. The method of claim 12 wherein the test structure has an area of less than 10,000 $\mu m^2$.

16. The method of claim 12 wherein the test structure has an area of less than 1,000 $m^2$.

17. The method of claim 12 wherein the insulating layer thickness is less than 22 Å.

18. A method for determining thickness of an insulating layer constructed between a conductive gate a nd a substrate, comprising the steps of:

forming at least one test structure at a surface of a substrate by the steps of:
  forming a bulk region of a semiconductor within said surface,
  creating at least one source region within the bulk region,
  creating at least one drain region within the bulk region such that each drain region is placed at a distance from one of the source regions,
  constructing a thin insulating layer above the each source region, each drain region, and the bulk region between said source region and said drain region, and
  placing the conductive gate above the thin insulating layer: and performing a capacitance-voltage measurement by the steps of:
  connecting the source region with the drain region of each test structure,
  placing a sense probe in contact the conductive gate of each test structure,
  placing a stimulus probe in contact with the source and drain region of each test structure to measure a capacitance value of said test structure, and
  placing a bulk biasing probe in contact with said bulk region between said source and drain region,
  varying a first voltage at said source and drain region to force said test structure into an in version state,
  forcing said bulk region to a second voltage to insure said inversion state, and
  measuring a first capacitance of said test structure, and
  determining the thickness of said insulating layer from said first capacitance.

19. The method of claim 18 further comprising the steps of:
  forcing the bulk region to a second voltage level equal to said first voltage, and
  measuring a second capacitance of said test structure,
  calculating a parasitic capacitance of said test structure as a difference between the second capacitance and the first capacitance.

20. The method of claim 18 wherein the test structure has an area of less than 10,000 $m^2$.

21. The method of claim 18 wherein the test structure has an area of less than 1,000 $\mu m^2$.

22. The method of claim 18 wherein the insulating layer thickness is less than 22 Å.

23. A method for measuring capacitance-voltage curves for a transistor, comprising the steps of:

providing a substrate having a well area having at least one isolation region and a well pick-up contact therein and the transistor thereon,
  said transistor comprising a gate, a gate dielectric, and source/drain regions;
measuring a first capacitance-voltage curve of the transistor under inversion and accumulation conditions by the step of:
  applying a direct current signal and an alternating current signal between the gate and a common connection of the source/drain regions and the well pick-up contact; and
measuring a second capacitance voltage curve of the transistor under inversion conditions by the steps of:
  applying the direct current signal and the alternating current signal between the gate and the source/drain regions, and
  floating the well pick-up contact.

24. The method of claim 23, further comprising the step of:
  determining a parasitic capacitance by the step of:
    obtaining a capacitance difference between the first and second capacitance-voltage curves under inversion condition.

25. The method of claim 24, further comprising the step of:
  determining the second capacitance-voltage curve under the accumulation condition by the difference between the first capacitance-voltage curve under the accumulation condition and the capacitance difference.

26. A method of measuring capacitance-voltage curves for a transistor, comprising the steps of:
  providing a substrate having a well area having at least one isolation region and a well pick-up contact therein and the transistor thereon,
    said transistor comprising a gate, a gate dielectric, and source/drain regions;
  measuring a first capacitance-voltage curve of the transistor under inversion and accumulation conditions by the step of:
    applying a direct current signal and an alternating current signal between the gate and a common connection of the source/drain regions and the well pick-up contact; and
  measuring a second capacitance-voltage curve of the transistor under inversion conditions by the steps of:
    applying the direct current signal and the alternating current signal between the gate and the source/drain regions, and
    applying a second direct current signal to the well pickup.

27. The method of claim 26, further comprising the step of:
  determining a parasitic capacitance by the step of:
    obtaining a capacitance difference between the first and second capacitance voltage curves under inversion condition.

28. The method of claim 27, further comprising the step of:
  determining the second capacitance-voltage curve under the accumulation condition by the difference between the first capacitance-voltage curve under the accumulation condition and the capacitance difference.

29. A method of measuring capacitance-voltage curves for a MOS transistor, comprising the steps of:
  providing a substrate having a well area having at least one isolation region and a well pick-up contact therein and the MOS transistor thereon,
  measuring a first capacitance-voltage curve of the MOS transistor under inversion and accumulation conditions by the step of:
    applying a direct current signal and an alternating current signal between a gate of said MOS transistor and a common connection of source/drain regions of said MOS transistor and the well pick-up contact; and
  measuring a second capacitance-voltage curve of the MOS transistor under inversion conditions by the steps of:
    applying the direct current signal and the alternating current signal between the gate and the source/drain regions, and
    floating the well pick-up contact.

30. The method of claim 29, further comprising the step of:
  determining a parasitic capacitance by the step of:
    obtaining a capacitance difference between the first and second capacitance-voltage curves under inversion condition.

31. The method of claim 30, further comprising the step of:
  determining the second capacitance-voltage curve under the accumulation condition by the difference between the first capacitance-voltage curve under the accumulation condition and the capacitance difference.

32. An apparatus for measuring capacitance-voltage curves for a transistor, which comprises a well pick-up contact, a gate, and source/drain regions, comprising:
  a measuring unit connected to said transistor
    for measuring a first capacitance-voltage curve of the transistor under inversion and accumulation conditions by connecting the gate and the source/drain regions and the well pick-up contact for applying a direct current signal and an alternating current signal between the gate and the source/drain regions, and
    for measuring a second capacitance-voltage curve of the transistor under inversion conditions by connecting the gate and the source/drain regions for the direct current signal and the alternating current signal are applied between two terminals and floating the well pick-up contact; and
  a characteristic calculating unit coupled to the measuring unit for obtaining the first and second capacitance-voltage curves under and calculating a parasitic capacitance as a capacitance difference between the first and second capacitance-voltage curves under inversion condition and for determining the second capacitance-voltage curve under the accumulation condition by the difference between the first capacitance-voltage curve under the accumulation condition and the parasitic capacitance.

* * * * *